(12) United States Patent
Hebert

(10) Patent No.: US 6,797,549 B2
(45) Date of Patent: Sep. 28, 2004

(54) HIGH VOLTAGE MOS TRANSISTOR WITH GATE EXTENSION

(75) Inventor: Francois Hebert, San Mateo, CA (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 10/272,688

(22) Filed: Oct. 15, 2002

(65) Prior Publication Data

US 2003/0038319 A1 Feb. 27, 2003

Related U.S. Application Data

(62) Division of application No. 09/564,108, filed on May 3, 2000.

(51) Int. Cl.$^7$ .............................................. H01L 21/00
(52) U.S. Cl. ..................... 438/159; 438/267; 438/270
(58) Field of Search ................................ 438/159, 197, 438/267, 270, 299, 454, 587–588; 257/331, 340, 341, 138, 333, 335, 346

(56) References Cited

U.S. PATENT DOCUMENTS

| | | | | |
|---|---|---|---|---|
| 4,099,196 A | * | 7/1978 | Simko .......................... | 257/317 |
| 5,023,694 A | * | 6/1991 | Yeh .............................. | 257/632 |
| 5,565,700 A | | 10/1996 | Chou et al. | |
| 5,640,033 A | | 6/1997 | Matsuoka | |
| 5,763,927 A | | 6/1998 | Koishikawa | |
| 5,841,166 A | * | 11/1998 | D'Anna et al. .............. | 257/335 |
| 5,912,490 A | * | 6/1999 | Hebert et al. ................ | 257/340 |
| 6,001,710 A | | 12/1999 | Francois | |
| 6,215,152 B1 | | 4/2001 | Hebert | |

FOREIGN PATENT DOCUMENTS

| | | |
|---|---|---|
| JP | 404116869 A | 4/1992 |

OTHER PUBLICATIONS

Claudio, Contiero et al., "Characteristics and Applications of a 0.6 $\mu$m Bipolar–CMOS–DMOS Technology combining VLSI Non–Volatile Memories," IEDM, pp. 465–468 (1996).
Yusuke Kawaguchi et al., "A low on–resistance 60 V MOS-FET high side switch and a 30 V npn transistor based on 5V BiCMOS process," BCTM, pp. 151–154 (1997).
Chin–Yu Tsai et al., "16–60V Rated LDMOS Show Advanced Performance in an 0.72 $\mu$m Evolution BiCMOS Power Technology," IEDM, pp. 367–370 (1997).
Paul G. Y. Tsui, "Integration of Power LDMOS into a Low–Voltage 05 $\mu$m BiCMOS Technology," IEDM, pp. 27–30 (1992).

* cited by examiner

Primary Examiner—Phat X. Cao
Assistant Examiner—Theresa T. Doan
(74) Attorney, Agent, or Firm—Fish & Neave; Robert W. Morris; Jeffrey D. Mullen

(57) ABSTRACT

A high voltage MOS transistor with a gate extension that has a reduced electric field in the drain region near the gate is provided. The high voltage MOS transistor includes a first and second gate layers, and a dielectric layer between the gate layers. The first and second gate layers are electrically coupled together and form the gate of the transistor. The second gate layer extends over the drain of the transistor above the dielectric and gate oxide layers to form the gate extension. The gate extension reduces the peak electric field in the drain by providing a wide area for the voltage to drop between the drain and the gate of the transistor. The dielectric layer also reduces the peak electric field in the drain near the gate by providing insulation between the gate and the drain. A lower electric field in the drain reduces the impact generation rate of carriers. The high voltage MOS transistor of the present invention may be fabricated without additional processing steps in BiCMOS and CMOS processes that use dual polysilicon layers and a dielectric layer that are used to form capacitors.

6 Claims, 5 Drawing Sheets

HIGH VOLTAGE MOS TRANSISTOR WITH GATE EXTENSION

CROSS REFERENCE TO RELATED APPLICATION

This application is a divisional of U.S. patent application Ser. No. 09/564,108, filed May 3, 2000, which is hereby incorporated by reference herein in its entirety.

BACKGROUND OF THE INVENTION

The present invention relates to apparatus and methods for high voltage transistors. More specifically, this invention relates to apparatus and methods for high voltage MOS transistors with a gate extension.

Many applications for semiconductor devices require MOS transistors that can operate with high voltages (e.g., greater than 40 volts) at their terminals. At a high drain-to-source voltage and a low gate voltage, the voltage drop between the drain and the gate of an MOS transistor across the gate oxide can produce a large electric field in the portion of the drain that is underneath the gate. If the gate overlaps the drain in a small area and the gate oxide layer is thin, the large electric field can cause a high impact generation rate of carriers that may result in hot carrier injection and breakdown. Hot carrier injection can cause carriers to become trapped in the gate oxide causing the threshold voltage of the transistor to change, which is undesirable. Breakdown may cause undesirable parasitic currents and device failure. A large electric field can also increase stress on the gate oxide layer increasing the chances of a device failure.

One previously known high voltage MOS transistor 10 is shown in FIG. 1A. In transistor 10, thick field oxide 11 is formed over N-type drain region 13, and a portion of gate 12 of transistor 10 is formed along the upper edge of thick field oxide 11 as shown in FIG. 1A. Thick field oxide 11 reduces the electric field in N-type drain region 13 below gate 12 to reduce the high impact generation rate of carriers. However, thick field oxide 11 causes transistor 10 to have undesirably large device dimensions. Thick field oxide 11 also increases the resistance between the drain-to-source ($R_{DS-ON}$) which is also undesirable, because field oxide 11 encroaches down into N-type drain region 13. A further disadvantage of transistor 10 is that the N-type doping concentration in N-type drain region 13 is higher near bird's beak 11A of thick oxide 11 than the N-type doping concentration near the lower boundary 11B of thick oxide 11. This effect causes an increased electric field under the gate which is also undesirable.

Another previously known high voltage MOS transistor 20 is shown in FIG. 1B. Transistor 20 has N-type extension region 22 which is an extension of the drain region of the transistor. N-extension 22 has a lower N-type doping concentration than highly doped N+ drain region 24. N-extension 22 increases the drain-to-body breakdown voltage in transistor 20. However, the peak electric field on the drain side is high at a high drain-to-source voltage. The high electric field in N-extension 22 may cause hot carrier injection in gate oxide 26.

Another previously known high voltage MOS transistor 30 is shown in FIG. 1C. Transistor 30 has gate oxide 36 and gate 32. Gate oxide 36 has a thick portion 36A that extends over N-extension region 22 as shown in FIG. 1C. Gate 32 of transistor 30 has a stepped portion 32A that extends over a portion of thick portion 36A of gate oxide 36. Transistor 30 has a reduced electric field and a reduced impact generation rate of carriers in N-extension 22 at high drain voltages. Transistor 30 requires additional process steps relating to the formation of thick oxide portion 36A that are not typically used in standard CMOS and BiCMOS processes. These additional steps increase the complexity and time associated with the fabrication of MOS transistor 30.

It would, however, be desirable to provide a MOS transistor that can operate at high voltages with a reduced peak electric field in the drain so that the impact generation rate is not high enough to cause breakdown or substantial hot carrier injection. It would further be desirable to provide a high voltage MOS transistor that can be fabricated with process steps that are standard in CMOS and BiCMOS processes.

SUMMARY OF THE INVENTION

It is an object of the present invention to provide a MOS transistor that can operate at high voltages with a reduced peak electric field in the drain so that the impact generation rate is not high enough to cause breakdown or substantial hot carrier injection.

It is also an object of the invention to provide a high voltage transistor that can be fabricated with process steps that are standard in CMOS and BiCMOS processes.

These and other objects of the present invention are provided by high voltage transistors with a gate extension. The present invention also includes methods for using and making high voltage transistors with a gate extension. The high voltage transistor with gate extension of the present invention includes a first and second gate layers, and a dielectric layer between the gate layers. The first and second gate layers are electrically coupled together by being in direct physical contact with each other or through another electrically conducting layer such as a metal contact. The first and second gate layers form the gate of the transistor. The first and second gate layers may be electrically coupled together over the active area of the device or over the field oxide region.

The first gate layer is disposed on the gate oxide layer. The second gate layer is disposed above at least a portion of the first gate layer. The second gate layer extends over the drain of the transistor above the dielectric and gate oxide layers to form the gate extension. The thickness of the gate extension can be reduced to form a stepped gate extension. The gate extension reduces the peak electric field in the drain near the gate by providing a wide area for the voltage to drop between the drain and the gate of the transistor. The dielectric layer also contributes to reducing the peak electric field in the gate side of the drain by providing insulation between the gate and the drain. The dielectric layer also reduces the parasitic gate-to-drain capacitance.

Many analog CMOS and BiCMOS processes provide dual polysilicon layers and a dielectric layer that can be used to form linear capacitors with low voltage coefficients. The two polysilicon layers and the dielectric layer in these CMOS and BiCMOS processes may be selectively patterned in the manner discussed below (with respect to FIGS. 2A–2G, 3A–3C, 4, and 5) to fabricate high voltage transistors of the present invention. Therefore, high voltage transistors of the present invention may be fabricated without additional processing steps when using analog CMOS and BiCMOS processes that use dual polysilicon layers.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE PREFERRED EMBODIMENT

High voltage MOS transistors with a gate extension of the present invention have a gate that includes a first and a second gate layers. A dielectric layer lies between the two gate layers. The second gate layer (also referred to as the upper gate layer) extends over the drain of the transistor above the dielectric and gate oxide layers to form the gate extension. The thickness of a portion of the gate extension over the drain can be reduced to form a stepped gate extension. The gate extension reduces the peak electric field in the gate side of the drain by providing a wide area for the voltage to drop between the drain and the gate.

The dielectric layer provides added insulation between the stepped gate extension of the upper gate layer and the drain that provides a reduced parasitic gate-to-drain capacitance. The dielectric layer also prevents large electric fields in the drain in the vicinity of the gate. Low electric fields reduce the impact generation rate of carriers in the drain reducing the likelihood of significant hot carrier injection and breakdown current. The high voltage MOS transistor with gate extension of the present invention may be fabricated without additional processing steps in BiCMOS and CMOS processes that provide dual polysilicon layers and a dielectric layer that can be used to form capacitors.

High voltage MOS transistors with a gate extension in accordance with the principles of the present invention may be fabricated without additional processing steps in BiCMOS and analog CMOS processes that have dual polysilicon layers and a dielectric layer that can be used to form linear capacitors with low voltage coefficients. The dielectric layer and the polysilicon layers may be selectively masked and deposited to form dielectric layer 122 and gate layers 116 and 124 as shown and discussed, for example, with respect to FIGS. 2A–2G, 3A–3C, 4, and 5. No additional layers or process steps are required.

Figure 2A:
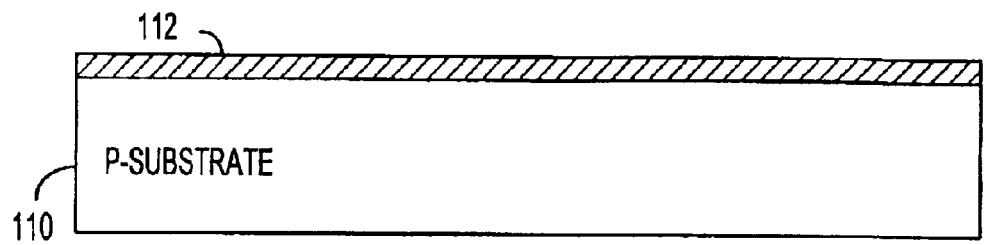
FIGS. 2A–2G are cross-sectional diagrams of process steps for the fabrication of an illustrative embodiment of a high voltage MOS transistor with a gate extension in accordance with the principles of the present invention.
Figure 2B:
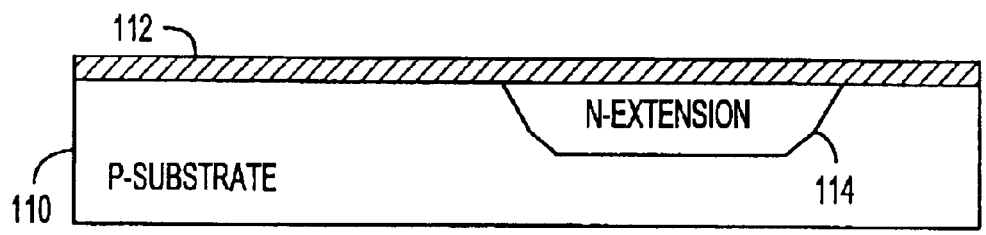

FIGS. 2A–2G are cross-section views of process steps for the fabrication of an embodiment of high voltage MOS transistors of the present invention. FIGS. 2A–2G illustrate steps for the fabrication of an NMOS transistor. PMOS transistors with a gate extension may also be made in accordance with the principles of the present invention simply by providing substrate, source, and drain regions of the opposite doping type shown in FIGS. 2A–2G, 3A–3C, 4, and 5. FIG. 2A shows an initial step of the process during which screen oxide layer 112 (e.g., 150–500 angstroms) is grown upon a silicon substrate. A portion 110 of the silicon P-type substrate is shown in FIG. 2A. A mask film such as photo-resist is applied to the surface of the oxide layer for selective implantation of N-type dopants. The N-type dopants are then driven into the substrate so that they diffuse down into P-substrate 110 to form N-extension region 114. N-extension region 114 is shown in FIG. 2B after the heating step. N-extension region 114 forms an extension of the drain of the MOS transistor. N-extension region 114 has a low net N-type doping concentration to increase the breakdown voltage at the drain-to-body junction.

Figure 2C:
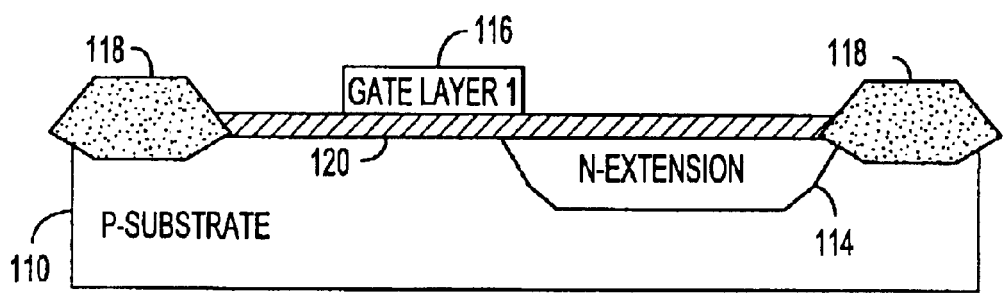

Selective oxidation may be performed using silicon nitride to form field oxide regions 118 in FIG. 2C. Field oxide regions 118 surround the MOS transistor of FIGS. 2C–2G to isolate it from neighboring devices. Screen oxide layer 112 is removed from P-substrate 110, and then gate oxidation may be performed to form gate oxide layer 120 over substrate 110 as shown in FIG. 2C. First gate layer 116 may then be formed over gate oxide 120 as shown in FIG. 2C. First gate layer 116 may be formed, for example, by blanket deposition and doping followed by selective masking and etching. First gate layer 116 must be formed of a conductive material that can withstand high temperatures. For example, layer 116 may be polysilicon, polycide, silicide, or refractory metal (such as Tantalum or Molybdenum). Examples of polycide that may be used to form layer 116 include $TiSi_2$, $TaSi_X$, and $WSi_X$ (e.g., X=2). Gate layer 116 may, for example, have a thickness of 2500 angstroms. A layer of silicide (not shown) may be formed over gate layer 116 to reduce the resistance of the gate. Following the formation of first gate layer 116 and preferably before dielectric 122 is formed, N-type LDD (low doped drain) implants may be formed on the source side of gate layer 116 (not shown) using masking and selective deposition to increase the breakdown voltage at the source-to-body junction. The low doped drain implants on the source side of the gate must be formed before source region 126, drain region 128, and dielectric 136. The formation of regions 126, 128, and layer 136 are discussed below with respect to FIG. 2F.

In a further embodiment of the present invention, N-extension region 114 may be formed in substrate 110 after the formation of oxide 120 and after gate layer 116 has been etched, instead of being formed as shown in FIG. 2B. N-extension 114 is self-aligned with gate layer 116 when formed between gate layer 116 and field oxide 118. N-extension region may appear as shown in FIG. 2C in this embodiment.

Figure 2D:
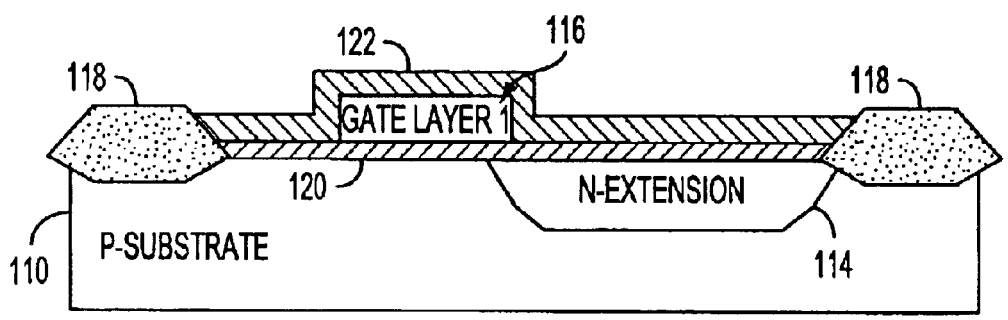

Dielectric layer deposition and masking may then be performed to form dielectric layer 122 over gate layer 116 and gate oxide layer 120 as shown in FIG. 2D. Dielectric layer 122 may be used in the same process to form capacitors. Dielectric layer 122 comprises an insulating material sufficient to prevent breakdown between gate layers 116 and 124. For example, dielectric layer 122 may be an oxide layer (preferred), a silicon nitride layer, an oxide-nitride (SiON) layer, or a sandwich of oxide-nitride-oxide multilayer films. Oxide used in dielectric 122 may be thermal oxide or deposited oxide. The oxide may be deposited using techniques such as plasma enhanced chemical vapor deposition or low pressure chemical vapor deposition with source gases such as $SiH_4$ or TEOS. Dielectric layer 122 may be, for example, 100–5000 angstroms thick (preferably 400 angstroms).

Figure 2E:
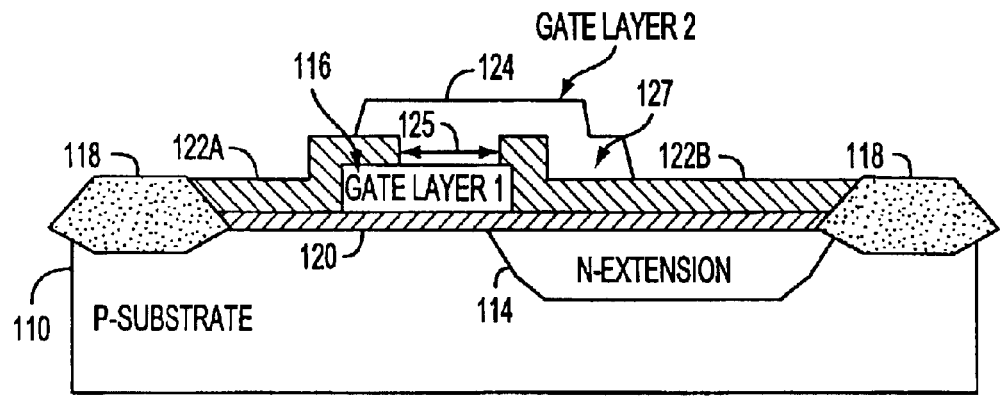

Selective masking and etching may then be performed to remove a portion of dielectric 122 to form opening 125 as shown in FIG. 2E. Opening 125 in dielectric 122 provides a window through which gate layers 116 and 124 come into electrical contact with each other. Opening 125 divides dielectric 122 into portions of 122A and 122B. Second gate layer 124 may then be formed over opening 125 and portions 122A and 122B of the dielectric as shown in FIG. 2E. Second gate layer 124 may be formed, for example, by blanket deposition and doping followed by selective masking and etching. Second gate layer 124 may be formed of any suitable conductive material such as polysilicon, polycide, silicide, or refractory metal (such as Tantalum or Molybdenum). Gate layer 124 may, for example, have a thickness of 2500 angstroms. Gate layers 116 and 124 physically contact each other through opening 125 so that they are electrically coupled together. Layers 124 and 116 form the gate of the MOS transistor. Care should be taken in ensuring no residual portions of the material used to form second gate layer 124 are adjacent to first gate layer 116, other than through opening 125.

Gate layer 124 extends laterally (to the right in FIG. 2E) over N-extension 114 to form gate extension 127. Gate extension 127 is the portion of gate layer 124 that extends laterally (to the right in FIGS. 2E–2G) beyond gate layer 116 as shown in FIG. 2E. Gate extension 127 may be, for example, 0.20 to 1.0 microns in length. Gate extension 127 can be made small with respect to the lateral length of N-extension 114 from gate layer 116 to N+ drain region 128 (FIG. 2F).

Gate patterning can be performed to form the contours of gate layer 124 shown in FIG. 2E. Specifically, the rightmost portion of gate layer 124 may be thinned so that its thickness is equal to the thickness of dielectric layer 122, forming a step in gate extension 127. The upper boundary of the rightmost portion of gate layer 124 is lower than the upper boundary of the rest of gate layer 124. Thus, gate extension 127 in FIGS. 2E–2G is a stepped gate extension. An isotropic or over-etch may be performed to remove spacers or stringers that are left around steps or the periphery of patterns such as with second gate layer 124.

Figure 2F:
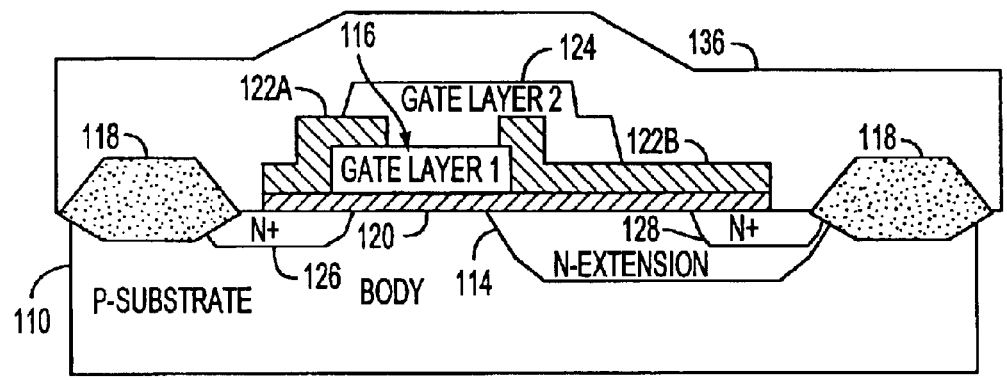
Figure 2G:
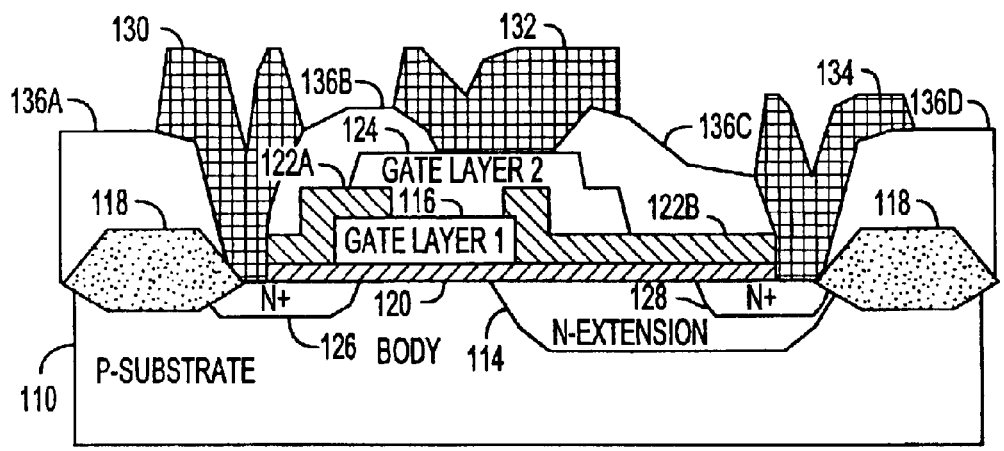

Selective masking and etching of dielectric layer portions 122A/122B and gate oxide 120 may be performed to remove the lateral edges of these layers near field oxide 118 as shown in FIG. 2F. A high concentration of N-type dopants may then be implanted into substrate 110 to form the highly doped N+ source and drain regions of the transistor. Dielectric layer 136 may be deposited on top of the MOS transistor as shown in FIG. 2F. The wafers may be heated to high temperature so that the N-type dopants diffuse into substrate 110 to form N+ region 126 and N+ region 128 as shown in FIG. 2F. N+ region 126 is the source of the transistor. N+ region 128 is a portion of the drain of the transistor. The drain includes regions 114 and 128. The region of P-substrate 110 between source region 126 and drain region 114 is the body region of the NMOS transistor.

A contact mask layer may be applied to the surface of dielectric layer 136 to form the pattern for the metal contacts to the gate, drain, and source of the transistor. Portions of dielectric layer 136 may then be selectively etched to form openings to the gate, source, and drain. Dielectric layer 136 is etched away down to the surfaces of N+ region 126, N+ region 128, and gate layer 124. Dielectric 136 may be further patterned to form dielectric regions 136A, 136B, 136C, and 136D shown in FIG. 2G. Metal deposition and patterning may be performed to form metal contacts 130, 132, and 134 shown in FIG. 2G. Metal contact 130 is electrically coupled to the source at N+ region 126. Metal contact 132 is electrically coupled to the gate of the transistor at gate layer 124. Metal contact 134 is electrically coupled to the drain at N+ region 128.

When the gate of the a prior art MOS transistor is at a low voltage and the drain is at a high voltage, the electric field in the region of the drain below the gate can be high enough to cause hot carrier injection and breakdown. Gate extension 127 in accordance with the principles of the present invention provides a wider area for the voltage to drop between the high drain voltage and the low gate voltage. The wider area provided by gate extension 127 spreads out the electric field lines between the gate and the drain, and reduces the peak electric field in near the gate side of the drain.

Region 114 of the drain is insulated from the gate (i.e., gate extension 127 of gate layer 124) by the thickness of gate oxide 120 and portion 122B of the dielectric layer. Dielectric layer portion 122B adds extra thickness to the insulating region between the gate and the drain of the transistor. Therefore, the thickness of gate oxide 120 does not need to be increased to add further insulation between the drain and the gate. The added insulation provided by dielectric layer 122B further reduces the peak electric field at the gate side of the drain.

The lower electric field provided by gate extension 127 and dielectric layer 122B reduces the impact generation rate of carriers in the gate side of the drain. The reduction in the impact generation rate of carriers allows the MOS transistor of FIG. 2G to operate at high voltages without experiencing breakdown or hot carrier injection. The lower electric field reduces electrical stress on gate oxide layer 120 thereby increasing the reliability of the transistor at high drain voltages. In addition, the extra insulation between gate extension 127 of gate layer 124 and the drain added by dielectric layer portion 122B reduces the parasitic gate-to-drain capacitance for a constant total gate length.

Figure 3A:
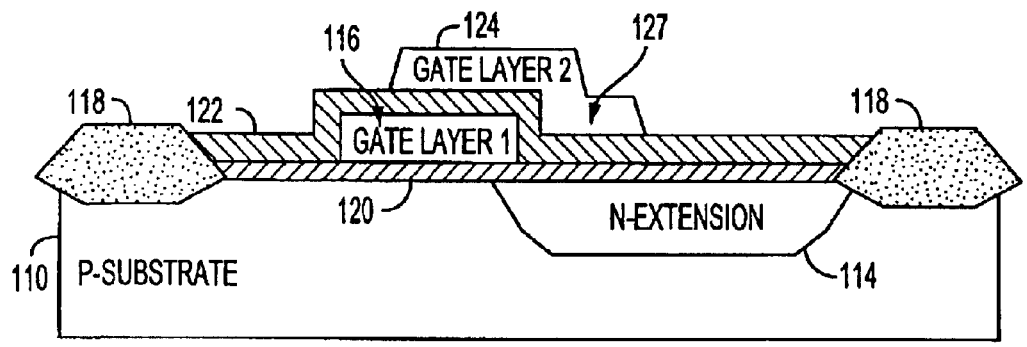
FIGS. 3A–3C are cross-sectional diagrams of process steps for the fabrication of another illustrative embodiment of a high voltage MOS transistor with a gate extension in accordance with the principles of the present invention.
Figure 3B:
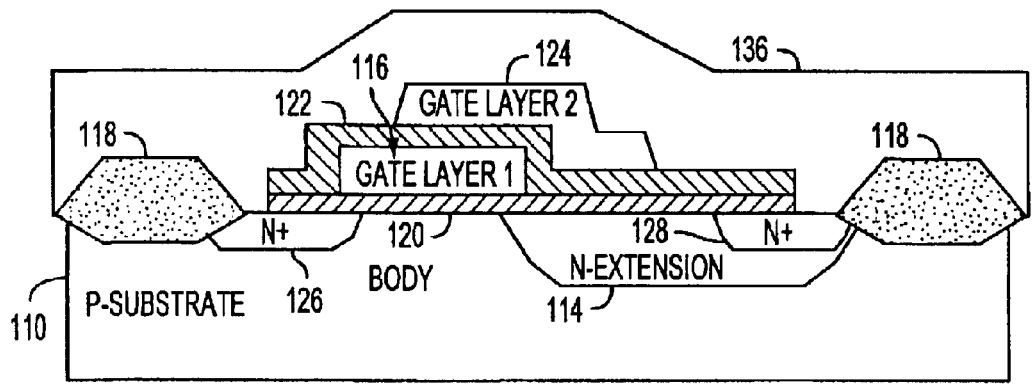
Figure 3C:
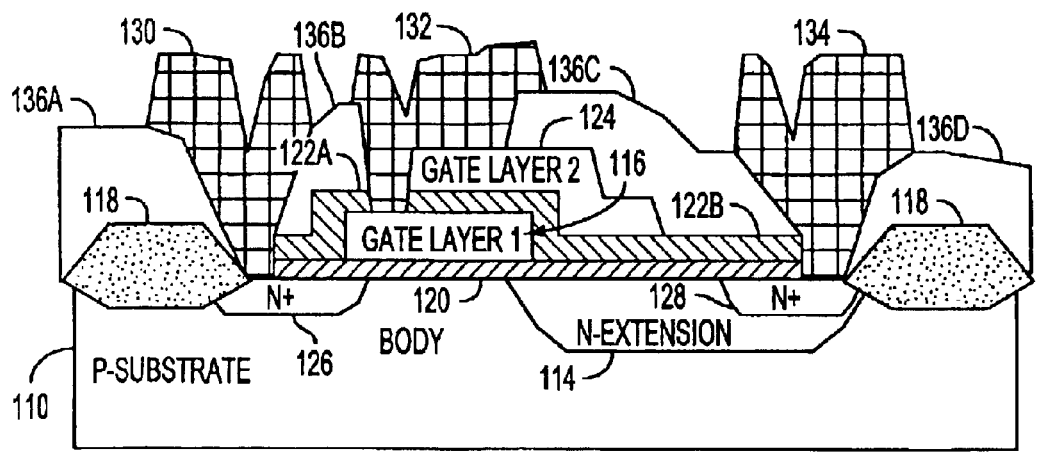

FIGS. 3A–3C illustrate process steps for the fabrication of a further embodiment of high voltage MOS transistors with a gate extension of the present invention. The steps shown and described above with respect FIGS. 2A–2D are the same initial steps used in this embodiment of the invention. FIGS. 3A–3C also illustrate process steps for the formation of an NMOS transistor. In the embodiment of FIGS. 3A–3C, the first and second gate layers are not in direct physical contact with each other. Instead, the first and second gate layers are coupled electrically to each other via a metal contact to the gate that physically contacts both of the first and second gate layers.

After dielectric layer 122 has been formed over first gate layer 116 and gate oxide 120 as shown in FIG. 2D, second gate layer 124 may then be formed over dielectric layer 122 as shown in FIG. 3A. Second gate layer 124 may be formed, for example, by blanket deposition and doping followed by selective masking and etching. Gate layer 124 extends laterally (to the right in FIG. 3A) over N-extension 114 to form gate extension 127. Gate layer 124 and gate extension 127 have the same characteristics discussed above with respect to FIG. 2E. Care should be taken in ensuring no residual portions of the material used to form second gate layer 124 are adjacent to first gate layer 116. Selective patterning may be performed to form the contours of gate layer 124 shown in FIG. 3A and discussed above with respect to FIG. 2E. An isotropic or over-etch may be performed to remove spacers or stringers that are left around steps or the periphery of patterns such as with second gate layer 124.

Source region 126, drain region 128, and dielectric layer 136 shown in FIG. 3B may be formed as discussed above with respect to FIG. 2F. The region of P-substrate 110 between source region 128 and drain region 114 is the body region of the NMOS transistor. A contact mask layer may be applied to the surface of dielectric layer 136 to form the pattern for the metal contacts to the gate, drain, and source of the transistor. Portions of dielectric layer 136 may then be selectively etched in three areas to form openings to the gate, source, and drain leaving dielectric regions 136A, 136B, 136C, and 136D as shown in FIG. 3C. Dielectric 136 is etched away down to N+ source region 126 and N+ drain region 128. Etching is also performed through dielectric layer 136 down through second gate layer 124 and through dielectric layer 122 to the surface of first gate layer 116 as shown in FIG. 3C. Dielectric layer 122 is now divided into regions 122A and 122B. Dielectric 136 may be further patterned to form the contours of dielectric regions 136A, 136B, 136C, and 136D shown in FIG. 3C.

Metal deposition and patterning may be performed to form metal contacts 130, 132, and 134 shown in FIG. 3C. Metal contact 130 is electrically coupled to the source at N+ region 126. Metal contact 132 physically contacts gate layer 124 and gate layer 116 through a hole in dielectric 122. Gate layers 116 and 124 are now coupled electrically together to form the gate of the transistor. Metal contact 134 is electrically coupled to the drain at N+ region 128. The high voltage transistor of FIG. 3C reduces electric fields in the gate side of the drain that can cause hot carrier injection and breakdown as discussed above with respect to FIGS. 2A–2G.

Figure 4:
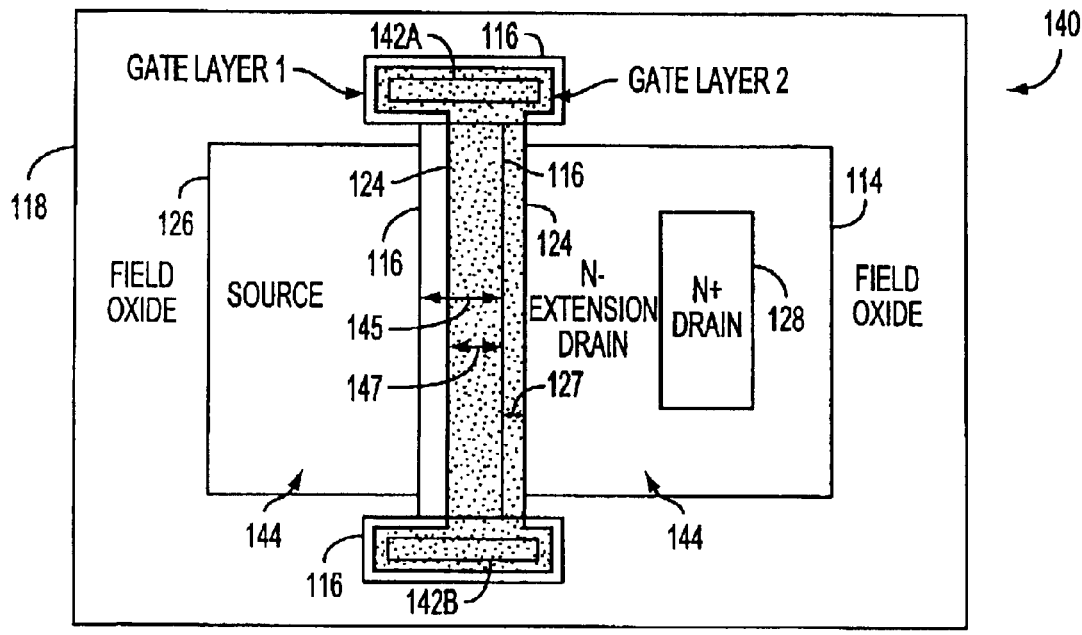
FIG. 4 is a top level diagram of an illustrative embodiment of a high voltage MOS transistor with a gate extension incorporating the present invention.

FIG. 4 illustrates a top level view of a further embodiment of high voltage MOS transistors with a gate extension of the present invention. Transistor 140 in FIG. 4 may be fabricated using the initial process steps shown and described with respect to FIGS. 2A–2D. The gate of transistor 140 includes gate layers 116 and 124. Gate layer 124 is formed over gate layer 116. The outlines of gate layer 116 are shown beneath gate layer 124 for clarity. Gate layer 124 includes gate extension 127 which may be a stepped gate extension. Transistor 140 has active area 144 that includes source region 126 to the left of the gate, and drain regions 114 and 128 to the right of the gate. Field oxide 118 surrounds active area 144. Dielectric layer 122 and gate oxide layer 120 are not shown in FIG. 4.

Further process steps in addition to those shown and described with respect to FIGS. 2A–2D are now described. Instead of an inter-layer contact between gate layers 116 and 124 being formed over active area 144 of the transistor as with the embodiments of FIGS. 2E–2G and 3C, inter-layer contacts 142A and 142B are formed over field oxide 118 outside active area 144 as shown in FIG. 4. Gate layers 116 and 124 do not contact each other over active area 144 in FIG. 4. Inter-layer contacts 142A and 142B are formed by selectively etching a portion of dielectric layer 122 down to the surface of gate layer 116 over field oxide 118 to form openings in the regions of inter-layer contacts 142A and 142B.

When gate layer 124 is deposited on top of dielectric 122, a portion of gate layer 124 penetrates the openings in dielectric 122 to form inter-layer contacts 142A and 142B, such that gate layer 116 and gate layer 124 are in direct physical contact with each other. Gate layers 116 and 124 are coupled electrically through inter-layer contacts 142A and 142B between the gate layers. Inter-layer contacts 142A and 142B are similar to the inter-layer contact formed through opening 125 shown in FIG. 2E, except that contacts 142A and 142B are not located over active area 144.

The gate length 145 of gate layer 116 and the overlap 147 of gate layers 116 and 124 can be minimized in transistor 140 since there is no need to make the gate length larger to fit the inter-layer contact over active area 144. Since the lengths 145 and 147 of the gate layers are minimized, the parasitic gate capacitance of transistor 140 is also advantageously minimized. Further processing steps may be performed as discussed above with respect to FIGS. 2F and 2G to form N+ regions 126 and 128, dielectric layer 136, and metal contacts 130, 132, and 134 in transistor 140.

Figure 5:
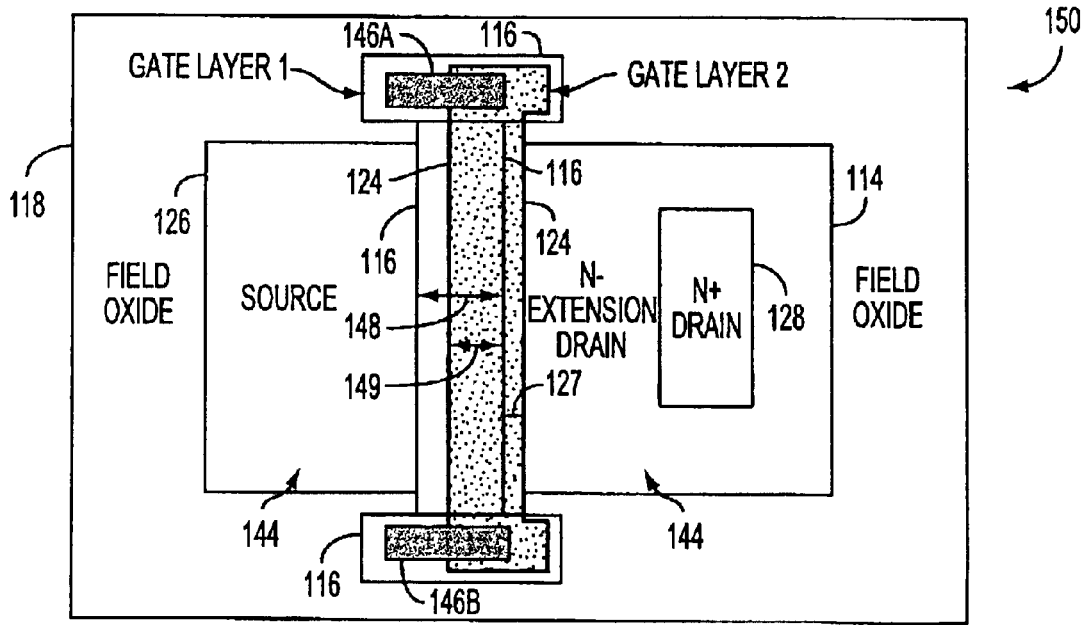
FIG. 5 is a top level diagram of an illustrative embodiment of a high voltage MOS transistor with a gate extension incorporating the present invention.

FIG. 5 illustrates a top level view of a further embodiment of a high voltage MOS transistor with a gate extension in accordance with the principles of the present invention. Transistor 150 in FIG. 5 may be fabricated using the process steps shown and described with respect to FIGS. 2A–2D and FIGS. 3A–3B. The gate of transistor 150 includes gate layers 116 and 124. Gate layer 124 is formed over gate layer 116. The outlines of gate layer 116 are shown beneath gate layer 124 for clarity. Gate layer 124 includes gate extension 127 which may be a stepped gate extension. Transistor 150 has active area 144 that includes source region 126 to the left of the gate, and drain regions 114 and 128 to the right of the gate. Field oxide 118 surrounds active area 144. Dielectric layer 122 and gate oxide layer 120 are not shown in FIG. 5.

Further process steps in addition to those shown and described with respect FIGS. 2A–2D and FIGS. 3A–3B are now described. In the embodiment of FIG. 5, inter-layer contacts 146A and 146B are formed over field oxide 118 outside active area 144. In the embodiment of FIG. 5, gate layers 116 and 124 are not electrically coupled together in the region over active area 144, and metal contact 132 (FIG. 3C) to the gate is not formed over active area 144. Instead, dielectric layer 136 is selectively etched over field oxide 118 exposing the surface of gate layers 116 and 124 in regions 146A and 146B. Metal contacts may be formed in inter-layer contact regions 146A and 146B where dielectric 136 has been removed to electrically couple gate layers 116 and 124 together, forming the gate of transistor 150. The metal contacts formed in regions 146A and 146B physically contact both of gate layers 116 and 124. Inter-layer contacts 146A and 146B are similar to the inter-layer contact formed by metal 132 in FIG. 3C in that the gate layers do not physically contact each other directly, but are electrically coupled together through a metal contact.

The gate length 148 of gate layer 116 and the overlap 149 of gate layers 116 and 124 can be minimized in transistor 150 since there is no need to make the gate length larger to fit the inter-layer contact over active area 144. Since the lengths 148 and 149 of the gate layers are minimized, the parasitic gate capacitance of transistor 150 is also advantageously minimized.

In a further embodiment of the present invention, a high voltage NMOS transistor with a gate extension may have an N-type substrate, and a P-well formed in the N-type substrate as the body region of the device. The source and drain regions may then be formed in the P-well body region. The present invention also includes PMOS transistors with N-type or P-type substrates, an N-type body region, and an extended drain region. PMOS and NMOS transistors with P-type or N-type epitaxial layers may also contain the features of the present invention. The gates of these NMOS and PMOS transistors may be formed as discussed above with respect to FIGS. 2A–2G, 3A–3C, 4 and 5.

Figure 1A:
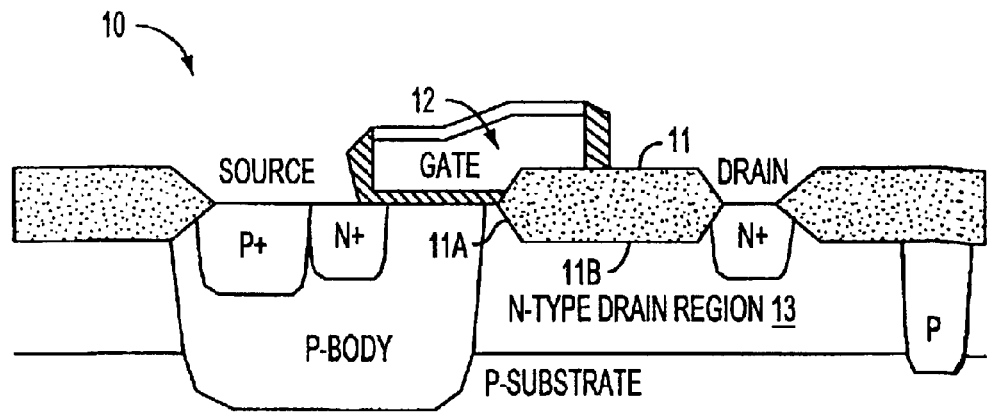
FIGS. 1A–1C are cross-sectional diagrams of prior art high voltage MOS transistors.
Figure 1B:
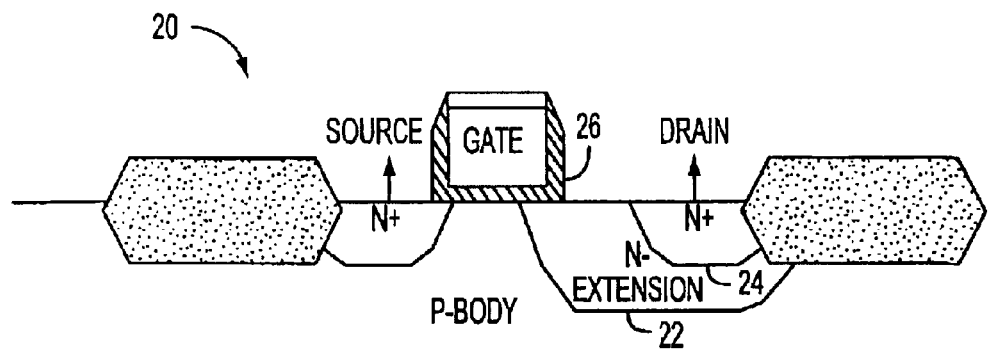
Figure 1C:
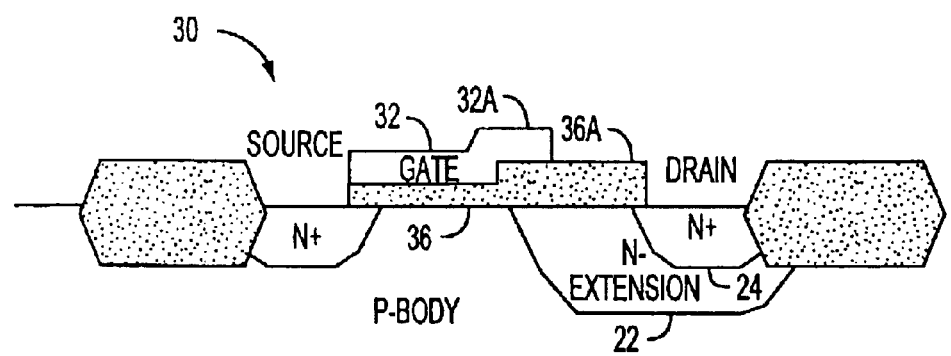

A two-dimensional computer simulated feasibility evaluation was done on the transistor with gate extension of the present invention. The transistor of the present invention was compared to the prior art standard planar device of FIG. 1B. The results are shown in the table below:

| Parameter | Prior Art Standard Planar Transistor of FIG. 1B | Transistor with Gate Extension of the Present Invention | Units |
|---|---|---|---|
| Breakdown Voltage | 50.16 | 53.5 | Volts |
| Peak Impact Generation Rate | $5 \times 10^{21}$ | $5 \times 10^{19}$ | ($V_{DS}$ = 50.1 volts)/ $scm^3$ |
| Peak Electric Field | $5.3 \times 10^5$ | $4.65 \times 10^5$ | ($V_{DS}$ = 50.1 volts) Volts/cm |

$V_{DS}$ represents the drain-to-source voltage across the device for the given simulation results. The MOS transistor of the present invention has an increased breakdown voltage, reduced peak impact generation rate, and reduced peak electric field compared to the prior art of FIG. 1B.

Persons skilled in the art further will recognize that the circuitry of the present invention may be implemented using structures and process steps other than those shown and discussed above. All such modifications are within the scope of the present invention, which is limited only by the claims which follow.

What is claimed is:

1. A method for forming a high voltage MOS transistor, the MOS transistor having a drain, source, and body regions in a semiconductor substrate, the method comprising:

forming a gate insulating layer on the semiconductor substrate;

forming a first gate layer on the gate insulating layer;

forming a dielectric layer over the gate insulating layer extending over at least a portion of the first gate layer;

forming a second gate layer disposed above at least a portion of the first gate layer and being electrically connected thereto, the second gate layer extending laterally over portions of the dielectric layer, the gate insulating layer, and the drain region, wherein forming the second gate layer further comprises forming the second gate layer to physically contact the first gate layer over the body region; and forming electrical contact to said second gate layer.

2. A method for forming a high voltage MOS transistor, the MOS transistor having a drain, source, and body regions in a semiconductor substrate, the method comprising:

forming a gate insulating layer on the semiconductor substrate;

forming a first gate layer on the gate insulating layer;

forming a dielectric layer over the gate insulating layer extending over at least a portion of the first gate layer;

forming a second gate layer disposed above at least a portion of the first gate layer and being electrically connected thereto, the second gate layer extending laterally over portions of the dielectric layer, the gate insulating layer, and the drain region, wherein forming the second gate layer further comprises forming the second gate layer to physically contact the first gate layer over the body region; and forming electrical contact to said second gate layer, wherein forming the electrical contact to the second gate layer further comprises forming a metal contact that is physically connected to the second gate layer.

3. A method for forming a high voltage MOS transistor, the MOS transistor having a drain, source, and body regions in a semiconductor substrate, the method comprising:

forming a gate insulating layer on the semiconductor substrate;

forming a first gate layer on the gate insulating layer;

forming a dielectric layer over the gate insulating layer extending over at least a portion of the first gate layer;

forming a second gate layer disposed above at least a portion of the first gate layer and being electrically coupled thereto, the second gate layer extending laterally over portions of the dielectric layer, the gate oxide layer, and the drain region; and forming electrical contact to said second gate layer, wherein forming the electrical contact to the second gate layer further comprises forming a metal contact to the gate that is physically connected to each of the first and second gate layers and wherein the first gate layer is electrically coupled to the second gate layer through the metal contact.

4. A method for forming a high voltage MOS transistor, the MOS transistor having a drain, source, and body regions in a semiconductor substrate, the method comprising:

forming a gate insulating layer on the semiconductor substrate;

forming a first gate layer on the gate insulating layer;

forming a dielectric layer over the gate insulating layer extending over at least a portion of the first gate layer;

forming a second gate layer disposed above at least a portion of the first gate layer and being electrically coupled thereto, the second gate layer extending laterally over portions of the dielectric layer, the gate oxide layer, and the drain region;

forming electrical contact to said second gate layer; and forming a field oxide region around the source, drain, and body regions, and wherein forming the second gate layer further comprises forming the second gate layer to physically contact the first fate layer over the field oxide region.

5. The method of claim 4 wherein forming the electrical contact to the second gate layer further comprises forming a metal contact that is physically connected to the second gate layer.

6. A method for forming a high voltage MOS transistor, the MOS transistor having a drain, source, and body regions in a semiconductor substrate, the method comprising:

forming a gate insulating layer on the semiconductor substrate;

forming a first gate layer on the gate insulating layer;

forming a dielectric layer over the gate insulating layer extending over at least a portion of the first gate layer;

forming a second gate layer disposed above at least a portion of the first gate layer and being electrically coupled thereto, the second gate layer extending laterally over portions of the dielectric layer, the gate oxide layer, and the drain region;

forming electrical contact to said second gate layer; and forming a field oxide region around the source, drain, and body regions, and wherein forming the electrical contact to the second gate layer further comprises forming a metal contact to the gate that is physically connected to the first and second gate layers, and wherein the first gate layer is electrically coupled to the second gate layer through the metal contact.

* * * * *